(12) United States Patent
Lee

(10) Patent No.: US 7,417,493 B2
(45) Date of Patent: Aug. 26, 2008

(54) VOLTAGE GENERATOR IN A FLASH MEMORY DEVICE

(75) Inventor: Seok Joo Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/617,419

(22) Filed: Dec. 28, 2006

(65) Prior Publication Data

US 2008/0111615 A1    May 15, 2008

(30) Foreign Application Priority Data

Sep. 29, 2006    (KR) .................. 10-2006-0096201

(51) Int. Cl.
*G05F 1/10* (2006.01)
(52) U.S. Cl. .................. 327/538; 327/513
(58) Field of Classification Search ............ 327/512, 327/513, 537, 538, 539, 543
See application file for complete search history.

(56) References Cited

U.S. PATENT DOCUMENTS

| 7,053,696 B2 * | 5/2006 | Shiratake et al. ............ 327/543 |
| 7,319,314 B1 * | 1/2008 | Maheshwari et al. ........ 323/313 |

FOREIGN PATENT DOCUMENTS

| JP | 2001-014879 A | 1/2001 |
| JP | 2002-025285 A | 1/2002 |

* cited by examiner

*Primary Examiner*—Jeffrey S Zweizig
(74) *Attorney, Agent, or Firm*—Townsend and Townsend and Crew LLP

(57) ABSTRACT

A flash memory device applies a low read voltage at increased flash memory device temperatures. A high read voltage is applied when a supply voltage is high, thereby maintaining a stable threshold voltage margin of a programmed cell or an erased cell. As a result, the reliability of the flash memory cell is enhanced.

17 Claims, 3 Drawing Sheets

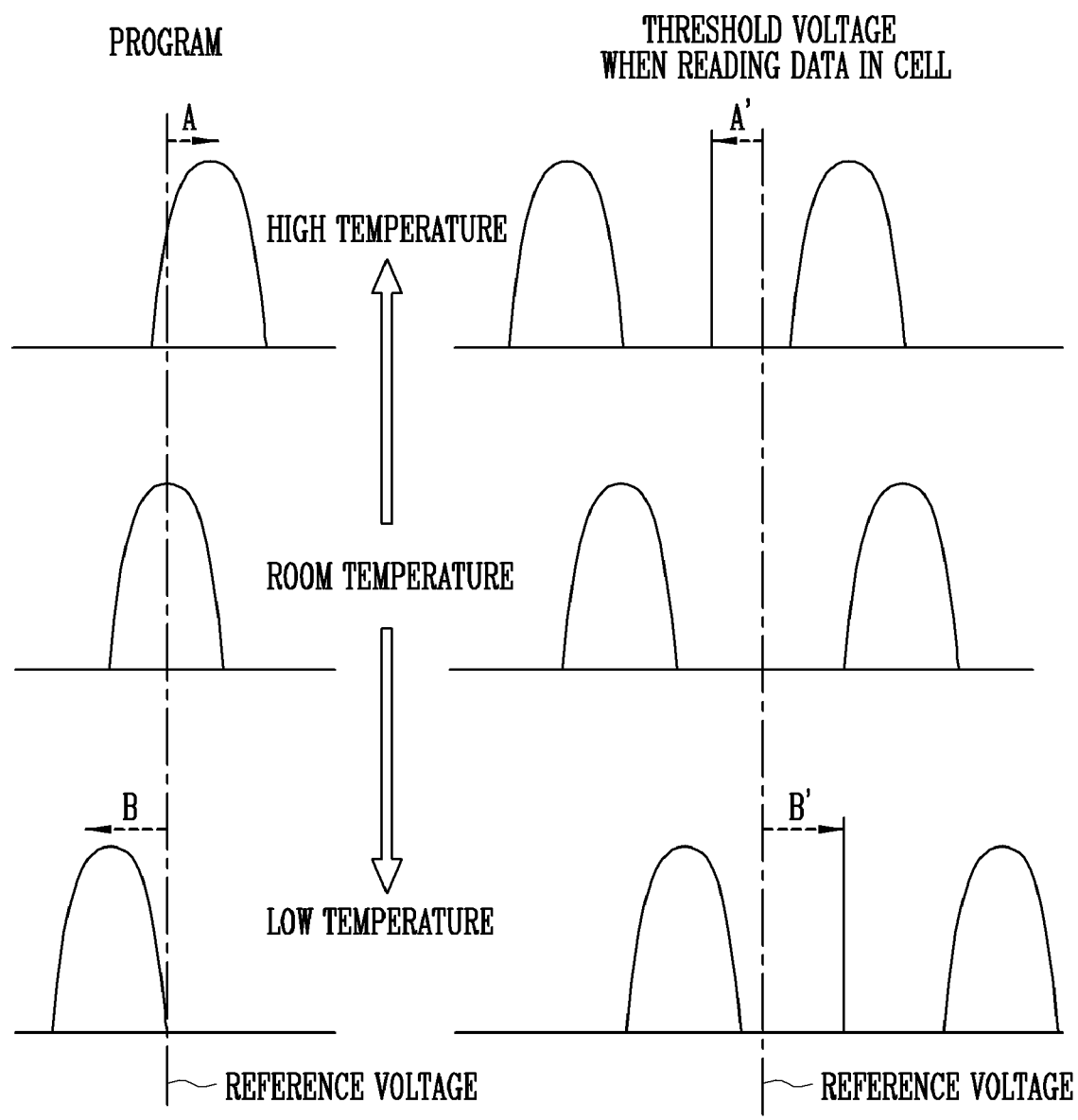

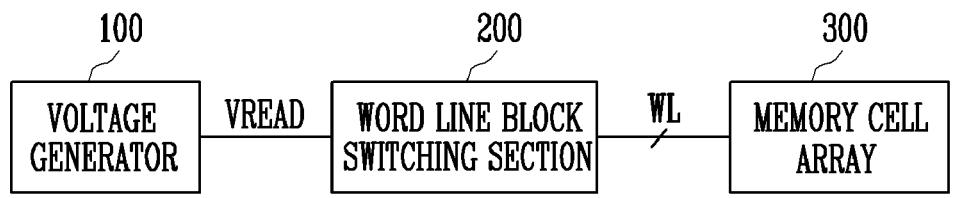
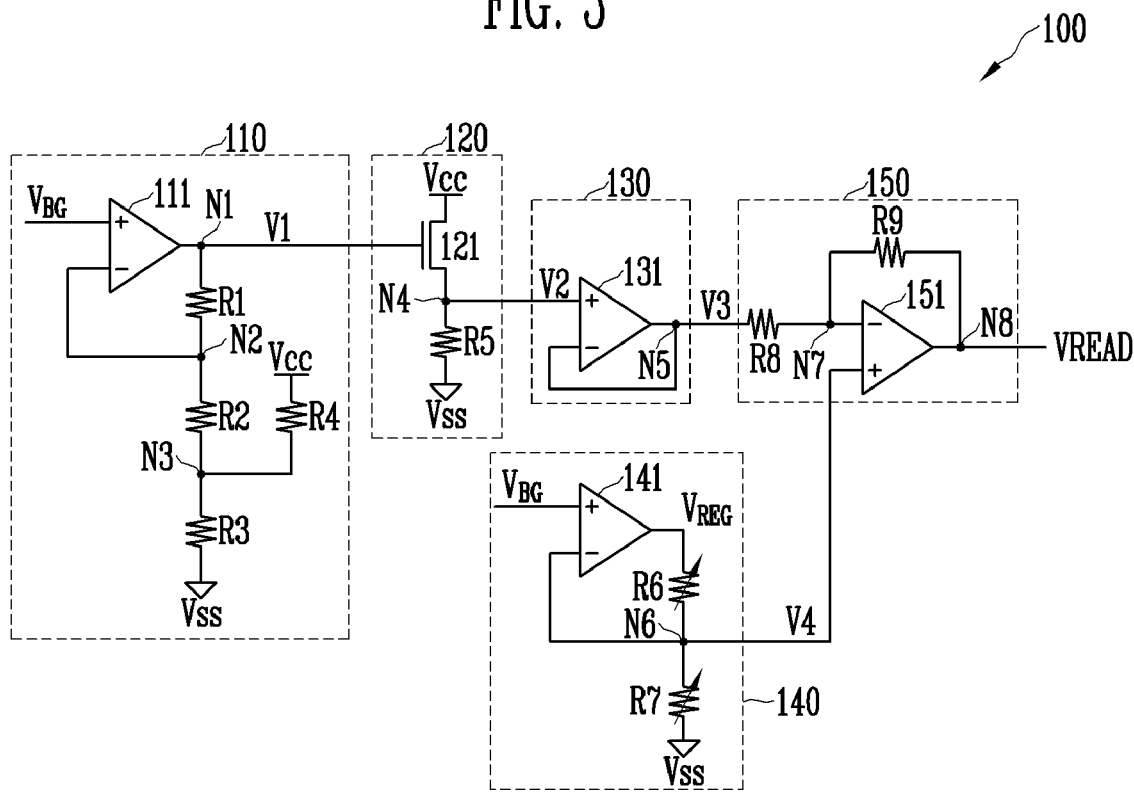

US 7,417,493 B2

VOLTAGE GENERATOR IN A FLASH MEMORY DEVICE

CROSS-REFERENCE TO RELATED APPLICATIONS

This application claims priority to Korean Patent Application No. 2006-96201, filed on Sep. 29, 2006, the contents of which are incorporated herein by reference in its entirety.

BACKGROUND OF THE INVENTION

The present invention relates to a voltage generator in a flash memory device, and more particularly to a generator for supplying a desired voltage irrespective of temperature of the flash memory device, and for supplying a supply voltage when reading data and verifying program operation.

Generally, the performance of program operations, erasing operations, reading operations, verifying operations, in a flash memory device depend on threshold voltage distribution. The threshold voltage distribution changes in accordance with a voltage when programming or erasing a cell in the flash memory device. Accordingly, when a reading operation or a verifying operation is performed by applying a constant voltage to a gate of a selected cell, error data may be read or verified. This is because the margin between a threshold voltage of a memory cell and the voltage applied to the gate of the memory cell is reduced.

FIG. 1 is a graph illustrating the common threshold voltage distribution of cells. The x-axis and y-axis of the graph indicate the threshold voltage and the number of cells, respectively.

A reference voltage may be fixed when programming a cell. Thus, increasing the operating temperature of the flash memory device also increases the threshold voltage of a programmed cell, as shown by A of FIG. 1.

When reading data in the cell after the cell is programmed, an increased temperature of the flash memory device reduces the threshold voltage of the cell, as shown by A' of FIG. 1. Accordingly, error data may be read due to a difference between a read voltage and the voltage of the programmed cell when reading data in the cell. In other words, when a cell is programmed at a low flash memory device temperature and when the cell is read at a high flash memory device temperature, the programmed cell may be misread as an erased cell. Likewise, the lower the temperature of the flash memory device, the lower the threshold voltage when programming the cell, as shown by B of FIG. 1.

When reading data in the cell after the cell is programmed, a low flash memory temperature increases the threshold voltage, as shown by B' of FIG. 1. Accordingly, when a cell is programmed at a high flash memory device temperature and when the cell is read at a low flash memory device temperature, an erased cell may be misread as a programmed cell.

SUMMARY OF THE INVENTION

The present invention provides a flash memory device for applying a low read voltage at increased flash memory device temperatures. A high read voltage is applied when a supply voltage is high, thereby maintaining a stable threshold voltage margin of a programmed cell or an erased cell. As a result, the reliability of the flash memory cell is enhanced.

A voltage generator in a flash memory device according to one embodiment of the present invention includes a first sub-voltage generator, a second sub-voltage generator, a buffer, a third sub-voltage generator and an amplifying section. The first sub-voltage generator generates a constant first voltage in response to a reference voltage and a supply voltage. The second sub-voltage generator generates a second voltage in response to the first voltage. The second voltage changes relative to a temperature change of the flash memory device. The buffer circuit outputs a third voltage in response to the second voltage. The third sub-voltage generator outputs a fourth voltage in response to the reference voltage. The fourth voltage changes relative to the supply voltage change. The amplifying circuit amplifies the fourth voltage in accordance with the third voltage.

A voltage generator of the present invention maintains a constant threshold voltage margin even though the temperature of a flash memory device and a supply voltage change when reading a cell. Thus, a programmed cell and an erased cell may be easily distinguished, and the reliability of the flash memory device is enhanced.

BRIEF DESCRIPTION OF THE DRAWINGS

The above and other features and advantages of the present invention will become readily apparent by reference to the following detailed description when considered in conjunction with the accompanying drawings wherein:

FIG. 1 is a graph illustrating a conventional distribution of the threshold voltage of cells;

FIG. 2 is a block diagram of a flash memory device having a voltage generator according to an embodiment of the present invention;

FIG. 3 is a schematic diagram illustrating circuitry of a voltage generator according to an embodiment of the present invention.

DESCRIPTION OF SPECIFIC EMBODIMENTS

Figure 4:
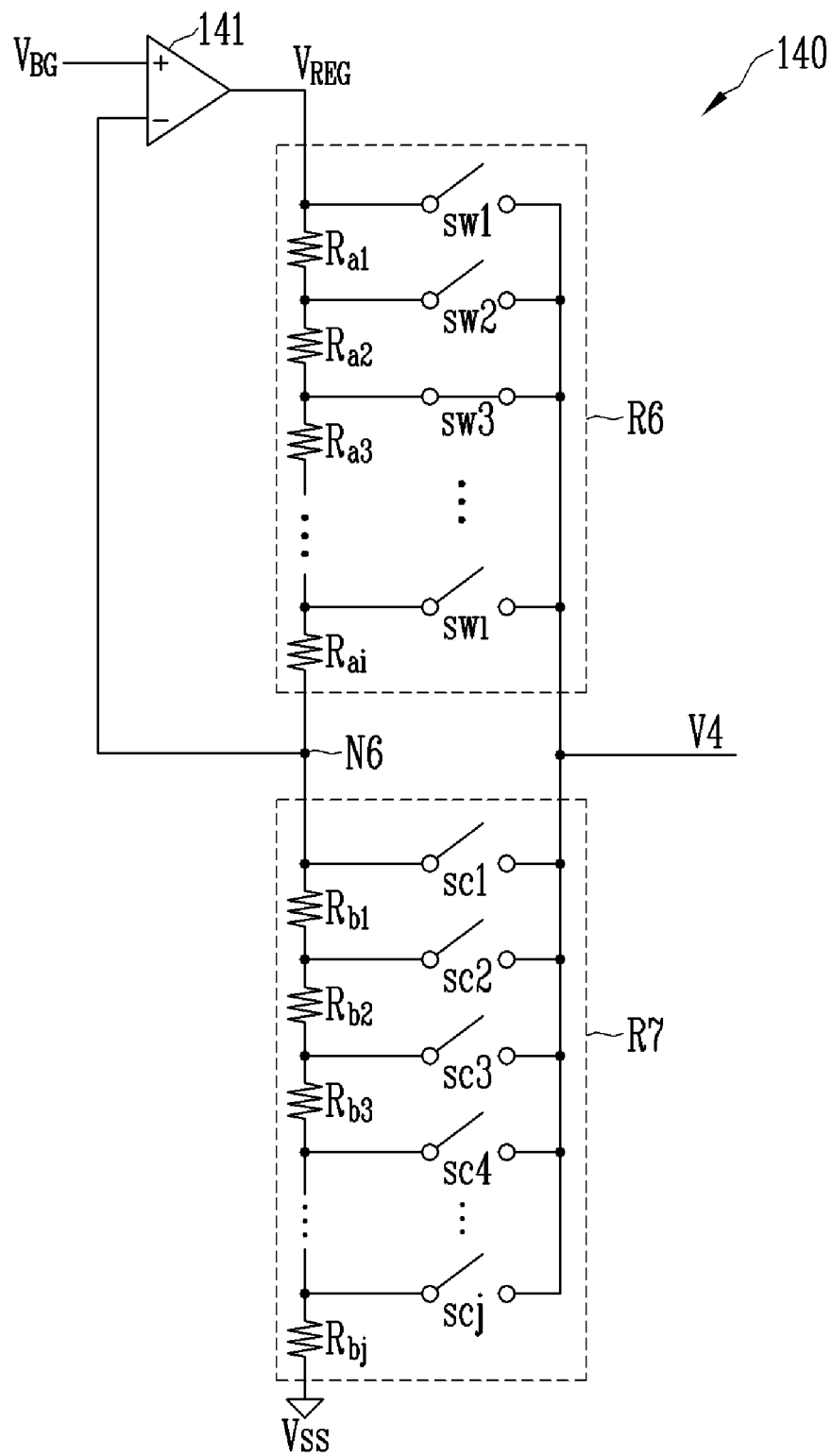
FIG. 4 is a schematic diagram illustrating a sub-voltage generator of the voltage generator according to an embodiment of the present invention.

Hereinafter, the preferred embodiments of the present invention will be explained in more detail with reference to the accompanying drawings.

FIG. 2 is a block diagram of a flash memory device having a voltage generator according to an embodiment of the present invention. The flash memory device of the present invention includes a voltage generator 100, a word line block switching section 200, a memory cell array 300 and a periphery circuit (not shown).

The voltage generator 100 outputs a read voltage (VREAD) that is used when reading data stored in a memory cell.

The word line block switching section 200 selects one word line block (not shown). The word line block switching section 200 outputs a voltage to word lines (WL) in accordance with the read voltage output from the voltage generator 100.

The memory cell array 300 includes a plurality of memory cells (not shown). Data is stored in a memory cell selected by one of the word lines and one bit line (not shown). The voltage generator 100 outputs a constant read voltage irrespective of any flash memory device temperature change and any change in a supply voltage. Thus, a constant voltage is applied to the word lines.

FIG. 3 is a schematic diagram illustrating circuitry of the voltage generator in FIG. 2. The voltage generator 100 includes a first sub-voltage generator 110, a second sub-voltage generator 120, a buffer circuit 130, a third sub-voltage generator 140 and an amplifying circuit 150.

The first sub-voltage generator 110 outputs a first voltage V1 in response to a reference voltage VBG and a supply voltage Vcc. The second sub-voltage generator 120 outputs a second voltage V2 in response to the first voltage V1. The buffer circuit 130 outputs a third voltage V3 in response to the second voltage V2. The third sub-voltage generator 140 outputs a fourth voltage V4 in response to the reference voltage VBG. The amplifying circuit 150 outputs a read voltage VREAD in response to the third voltage V3 and the fourth voltage V4.

The first sub-voltage generator 110 includes a comparator 111 and resistors (R1 to R4). The comparator 111 compares the reference voltage VBG with a voltage at a second node N2. The comparator 111 outputs the first voltage V1 to a first node N1 in accordance with the comparison result. First, second and third resistors R1, R2, R3 are connected in series between the first node N1 and a ground voltage Vss. A fourth resistor R4 is connected between a third node N3 and the supply voltage Vcc. The third node N3 is a junction of the second resistor R2 and the third resistor R3. The supply voltage Vcc is applied to the third node N3 through the fourth resistor R4.

The comparator 111 compares the voltage of the second node N2 with the reference voltage VBG. The comparator 111 outputs the first voltage V1 in accordance with the comparison result. The voltage at the second node N2 is determined by the first resistor R1 and the second resistor R2. The first voltage V1 is determined using Equation 1.

$$V1 = \left[1 + \frac{R1}{R2}\left(1 - \frac{R3R4}{R2R3 + R3R4 + R4R2}\right)\right]V_{BG} - \frac{R1R3}{R2R3 + R3R4 + R4R1}V_{CC}\frac{\Delta V1}{\Delta V_{CC}} = -\frac{R1R3}{R2R3 + R3R4 + R4R2} = -k$$ [Equation 1]

where k indicates a change in a threshold voltage.

The reference voltage VBG is a constant voltage that is provided as an input of the comparator 111. A change in the first voltage V1 is inversely proportionate to a change of the supply voltage (i.e., k always has negative value).

The second sub-voltage generator 120 includes an N-MOS transistor 121 and a resistor R5. The N-MOS transistor 121 is connected between the supply voltage Vcc and a fourth node N4. The N-MOS transistor 121 is responsive to the first voltage V1. The resistor R5 is connected between the fourth node N4 and the ground voltage Vss. The second voltage V2 is output to the fourth node N4.

In the event that product of the beta of the N-MOS transistor 121 and the resistance of the resistor R5 is very high, the second voltage V2 is equal to the first voltage V1 applied to a gate of the N-MOS transistor 121 minus a threshold voltage Vth of the N-MOS transistor 121. In other words, when the first voltage V1 has a constant value irrespective of the flash memory device temperature, the effect of temperature on the second voltage V2 is inversely proportionate to the effect of temperature on the threshold voltage Vth.

The buffer circuit 130 includes a comparator 131. The comparator 131 compares the second voltage V2 with a voltage at a fifth node N5. The comparator 131 provides the third voltage V3 at the fifth node N5 in accordance with the comparison result. The comparator 131 also provides the third voltage V3 as feedback (i.e., as an input voltage to the comparator 131). The feedback increases an output driving force of the comparator 131.

The third sub-voltage generator 140 includes a comparator 141 and variable resistors R6 and R7. The comparator 141 receives as inputs the reference voltage VBG and a voltage at a sixth node N6. The comparator 141 generates an output voltage VREG based on the received reference voltage VBG and the voltage at the sixth node N6. The first and second variable resistors R6 and R7 are connected in series between the comparator 141 and the ground voltage Vss. The voltage at the sixth node N6 is a voltage between the first and second variable resistors R6 and R7. The voltage at node N6 is applied as feedback to a negative input terminal of the comparator 141. The first and second variable resistors R6 and R7 will be described in detail with reference to FIG. 4.

FIG. 4 is a schematic diagram illustrating the third sub-voltage generator in FIG. 3. The first variable resistor R6 includes a plurality of resistors Ra1 to Rai and a plurality of switches SW1 to SWi. The switches SW1 to SWi are connected in parallel. The resistors Ra1 to Rai are each connected between adjacent switches SW1 to SWi. The second variable resistor R7 includes a plurality of resistors Rb1 to Rbj and a plurality of switches SC1 to SCj. The switches SC1 to SCj are connected in parallel. The resistors Rb1 to Rbj are each connected to adjacent switches SC1 to SCj.

The fourth voltage V4 is output using a circuit in which a plurality of resistors are disposed and a switch is activated (e.g. switch SW3). The value of the fourth voltage V4 corresponds to the voltage of the resistors between the output of the comparator 141 and an output terminal between the first resistor R6 and the second resistor R7. The value of the fourth voltage is therefore dependent on which switch is activated. This feature is useful to a multi level cell that uses a plurality of read voltages and a plurality of verification voltages.

The fourth voltage V4 is determined using Equation 2.

$$V4 = \left(1 + \frac{R6}{R7}\right)V_{BG}$$ [Equation 2]

wherein V4 is the fourth voltage,
R6 is the resistance of the first variable resistor,
R7 is the resistance of the second variable resistor, and
VBG is the reference voltage.

Referring to FIG. 3, the amplifying circuit 150 includes an amplifier 151 and resistors R8 and R9. The resistor R8 is connected between the fifth node N5 and a seventh node N7. The resistor R9 is connected between the seventh node N7 and an eighth node N8.

The amplifier 151 receives as inputs the third voltage V3 applied to the seventh node N7 and the fourth voltage V4 output from the third sub-voltage generator 140. The amplifier 151 amplifies the difference of the voltages V3 and V4 by a voltage level corresponding to the resistance ratio of the resistors R9/R8. The read voltage VREAD is output to the eighth node N8.

The read voltage VREAD is determined using Equation 3.

$$VREAD = V4 + \frac{R9}{R8}(V4 - V3)$$ [Equation 3]

As seen in Equation 3, the difference between the voltages V3 and V4 input to the amplifier 151 is amplified by a value corresponding to the resistance ratio of the resistors R8 and R9.

The read voltage VREAD, which is the last output, is determined using Equation 4.

$$VREAD = V4 + \frac{R9}{R8}(V4 - V2(T, Vcc))  \quad \text{[Equation 4]}$$

where V2(T, Vcc) indicates the value by which the second voltage V2 has changed due to changes in temperature and a change in the supply voltage.

The effect of the temperature and the supply voltage on the elements of the voltage generator 100 may be expressed by Equations 5 and 6. Equation 5 expresses the effect of the temperature, and Equation 6 expresses the effect of the supply voltage.

$$\frac{\Delta VREAD(T, Vcc)}{\Delta T} = \quad \text{[Equation 5]}$$
$$-\frac{R9}{R8}\frac{\Delta V2(T, Vcc)}{\Delta T} = \frac{R9}{R8}\frac{\Delta Vth(NMOS)}{\Delta T} < 0$$

$$\frac{\Delta VREAD(T, Vcc)}{\Delta Vcc} = \quad \text{[Equation 6]}$$
$$-\frac{R9}{R8}\frac{\Delta V2(T, Vcc)}{\Delta Vcc} = \frac{R9}{R8}\frac{R1R3}{R2R3 + R3R4 + R4R2} > 0$$

Referring to Equation 5, an increase in the temperature T reduces the read voltage VREAD proportionately. Referring to Equation 6, an increase in supply voltage Vcc increases the read voltage VREAD proportionately. Accordingly, the threshold voltage of the programmed cell and the erased cell may be maintained irrespective of a temperature change in the flash memory device and a change in the supply voltage Vcc. Particularly, the resistance ratio of resistors R9/R8 may be adjusted to offset the rate of temperature change and the threshold voltage Vth change of a memory cell. This relationship is expressed in Equation 7.

$$\frac{R9}{R8}Vth(NMOS) - Vth(Cell) \quad \text{[Equation 7]}$$

where Vth(NMOS) is the threshold voltage of the N-MOS transistor 121 and Vth(Cell) is the threshold voltage of the cell.

To offset the change rate of the supply voltage Vcc and the threshold voltage Vth of the memory cell, the resistors R8 and R9 are adjusted so that the value (k) of change of the threshold voltage Vth of the memory cell has an appropriate value. The value of k is expressed in Equation 8.

$$k = \frac{R9}{R8}\frac{R1R3}{R2R3 + R3R4 + R4R2} \quad \text{[Equation 8]}$$

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A voltage generator in a flash memory device, the voltage generator comprising:
   a first sub-voltage generator configured to generate a first voltage having a constant value in response to a reference voltage and a supply voltage;
   a second sub-voltage generator configured to generate a second voltage in response to the first voltage, wherein the second voltage changes relative to a temperature change of the flash memory device;
   a buffer circuit configured to output a third voltage in response to the second voltage;
   a third sub-voltage generator configured to output a fourth voltage in response to the reference voltage, wherein the fourth voltage changes relative to a change in the supply voltage; and
   an amplifying circuit configured to amplify the fourth voltage based on the third voltage.

2. The voltage generator of claim 1, wherein the first sub-voltage generator includes:
   a comparator configured to compare the reference voltage with a portion of the first voltage, and output the first voltage in accordance with the comparison result; and
   a plurality of resistors that are configured to provide the first voltage with a constant value.

3. The voltage generator of claim 1, wherein the second sub-voltage generator includes:
   an N-MOS transistor configured to operate in response to the first voltage;
   wherein the second sub-voltage generator outputs a second voltage that is effected by temperature contrary to the effect that temperature has on the N-MOS transistor.

4. The voltage generator of claim 1, wherein the third sub-voltage generator includes:
   a comparator configured to compare the reference voltage with the fourth voltage, and output an output voltage based on the comparison result; and
   a variable resistor circuit,
   wherein the resistance of the variable resistor circuit changes relative to a change in the supply voltage, and the variable resistor circuit outputs a fourth voltage corresponding to the changed resistance of the variable resistor circuit.

5. The voltage generator of claim 4, wherein the variable resistor circuit includes resistors and switches,
   wherein the value of the fourth voltage is dependent on which switch in the variable resistor circuit is activated.

6. A voltage generator in a flash memory device, the voltage generator comprising:
   a first sub-voltage generator configured to generate a first voltage having a constant value in response to a reference voltage and a supply voltage;
   a second sub-voltage generator configured to generate a second voltage in response to the first voltage, wherein the second voltage changes relative to a temperature change of the flash memory device;

a buffer circuit configured to output a third voltage in response to the second voltage; and a third sub-voltage generator configured to output a fourth voltage in response to the reference voltage, wherein the fourth voltage changes relative to a change in the supply voltage.

7. The voltage generator of claim 6, further comprising an amplifying circuit configured to amplify the fourth voltage based on the third voltage, the amplifying circuit generating a fifth voltage.

8. The voltage generator of claim 7, wherein an increase in the temperature of the flash memory device results in a decrease of the fifth voltage.

9. The voltage generator of claim 7, wherein an increase in the supply voltage results in a decrease of the fifth voltage.

10. The voltage generator of claim 6, wherein the first sub-voltage generator comprises a comparator that generates the first voltage in response to the reference voltage and the supply voltage.

11. The voltage generator of claim 6, wherein the reference voltage has a constant value.

12. The voltage generator of claim 6, wherein a change in the first voltage is inversely proportionate to a change in the supply voltage.

13. The voltage generator of claim 6, wherein the second sub-voltage generator comprises an N-MOS, the effect of temperature on the second voltage being inversely proportionate to a threshold voltage of the N-MOS device.

14. The voltage generator of claim 6, wherein the second voltage changes relative to a change in the supply voltage.

15. The voltage generator of claim 6, wherein the buffer circuit comprises a comparator.

16. The voltage generator of claim 6, wherein the third sub-voltage generator comprises a comparator and two variable resistor circuits, the comparator receiving as inputs the reference voltage and a voltage generated at a junction between the two variable resistor circuits, the fourth voltage being dependent on the reference voltage and the resistance values of the variable resistor circuits.

17. The voltage generator of claim 16, wherein each variable resistor circuit comprises a plurality of switches connected in parallel and a plurality of resistors each connected to adjacent switches, the fourth voltage being dependent on which switch is activated.

* * * * *